US012571877B2

(12) United States Patent
Belitzer et al.

(10) Patent No.: US 12,571,877 B2
(45) Date of Patent: Mar. 10, 2026

(54) POWER CONTROL UNIT AND METHOD FOR CONTROLLING THE SUPPLY VOLTAGE OF A RADAR POWER AMPLIFIER

(71) Applicant: Infineon Technologies AG, Neubiberg (DE)

(72) Inventors: Alexander Belitzer, Munich (DE); Kambiz Hadipour Abkenar, Linz (AT)

(73) Assignee: Infineon Technologies AG, Neubiberg (DE)

( * ) Notice: Subject to any disclaimer, the term of this patent is extended or adjusted under 35 U.S.C. 154(b) by 363 days.

(21) Appl. No.: 18/183,800

(22) Filed: Mar. 14, 2023

(65) Prior Publication Data

US 2023/0324506 A1    Oct. 12, 2023

(30) Foreign Application Priority Data

Mar. 22, 2022    (DE) .......................... 102022106684.3

(51) Int. Cl.
| | |
|---|---|
| *G01S 7/02* | (2006.01) |
| *H03F 3/189* | (2006.01) |
| *H04B 1/04* | (2006.01) |
| *H04B 1/16* | (2006.01) |
| *H04B 1/40* | (2015.01) |

(52) U.S. Cl.
CPC ................ *G01S 7/02* (2013.01); *H03F 3/189* (2013.01); *H04B 1/04* (2013.01); *H04B 1/1607* (2013.01); *H04B 1/40* (2013.01); *H03F 2200/451* (2013.01); *H04B 2001/0408* (2013.01)

(58) Field of Classification Search
CPC . G01S 7/02; G01S 13/343; G01S 7/03; G01S 7/032; H03F 3/189; H03F 2200/451; H03F 3/245; H04B 1/04; H04B 1/1607; H04B 1/40; H04B 2001/0408
See application file for complete search history.

(56) References Cited

U.S. PATENT DOCUMENTS

| | | | |
|---|---|---|---|
| 11,616,295 B2 * | 3/2023 | Marr, Jr. ................. | H03F 3/245 |
| | | | 342/120 |
| 2007/0146076 A1 * | 6/2007 | Baba .................... | H03G 3/3042 |
| | | | 330/297 |
| 2013/0099861 A1 | 4/2013 | Zhang | |
| 2018/0123516 A1 | 5/2018 | Kim et al. | |
| 2018/0198414 A1 | 7/2018 | Jales | |
| 2022/0018929 A1 * | 1/2022 | Montoriol ................. | G01S 7/35 |
| 2022/0045712 A1 | 2/2022 | Berhane et al. | |

* cited by examiner

*Primary Examiner* — Vladimir Magloire
*Assistant Examiner* — Anna K. Gosling
(74) *Attorney, Agent, or Firm* — Harrity & Harrity, LLP

(57) ABSTRACT

A power control unit is provided that is configured to generate a supply voltage control signal for controlling a supply voltage of a radar power amplifier, which is configured to receive an input signal and to output a radar transmit signal. The power control unit is configured to receive a first information signal indicative of a transmit power of the radar transmit signal and a second information signal indicative of timing information of the input signal, and generate the supply voltage control signal such that the supply voltage of the radar power amplifier is set to a supply voltage value for a duration of time. The supply voltage value depends on the first information signal and the duration of time depends on the second information signal.

24 Claims, 9 Drawing Sheets

S1

S2

S3

S4

S5

S6

POWER CONTROL UNIT AND METHOD FOR CONTROLLING THE SUPPLY VOLTAGE OF A RADAR POWER AMPLIFIER

CROSS REFERENCE TO RELATED APPLICATION

This application claims priority to German Patent Application No. 102022106684.3, filed on Mar. 22, 2022, the contents of which are incorporated by reference herein in their entirety.

TECHNICAL FIELD

The present disclosure relates to the field of voltage supply for radar power amplifiers and in particular to an apparatus and a method for controlling the supply voltage of a radar power amplifier.

BACKGROUND

Radar systems (radar: Radio Detection and Ranging) comprise a transmitter and a receiver and may comprise a plurality of transmitters and a plurality of receivers. The transmitter sends out radio waves that hit an object and are reflected. The reflected radio waves are received by the receiver. This allows to determine the object's distance, velocity and/or direction in relation to the radar system. Radar systems operate in the microwave GHz range and have a broad spectrum of applications, including air traffic, weather, marine etc.

Radar systems are increasingly being used in the automotive sector for e.g., autonomous driving and/or other advanced driver assistance systems like adaptive cruise control, lane change assist, blind spot detection and the like. Automotive radars may be used to detect the speed, range and/or direction of objects in the vicinity of the car. Automotive radars may for example use a frequency band around 24 GHz for short-range radar or a frequency band around 77 GHz, e.g., from 76 GHz to 81 GHz, for long-range radar.

A radio transceiver is an electronic device, which is a combination of a radio transmitter and a radio receiver. Its radio frequency (RF) circuits may sometimes be referred to as RF frontend. Radar transceivers can for example be realized on a single chip with highly integrated RF circuits, combining functions of the RF frontend in a single housing. An example of such a highly integrated design is a monolithic microwave integrated circuit (MMIC), where functions of the radar transceiver, including the RF circuits of the transceiver, may be realized. One of the RF circuits of a radar transmitter usually is a radar power amplifier (PA), which converts a lower power radar input signal into a higher power radar output signal.

SUMMARY

According to one aspect of the disclosure, a power control unit is configured to generate a supply voltage control signal for controlling a supply voltage of a radar power amplifier. The radar power amplifier is configured to receive an input signal and to output a radar transmit signal. The power control unit is configured to receive a first information signal indicative of a transmit power of the radar transmit signal and a second information signal indicative of timing information of the input signal. The power control unit is further configured to generate the supply voltage control signal, such that the supply voltage of the radar power amplifier is set to a first supply voltage value for a first duration of time. The first supply voltage value depends on the first information signal and the first duration of time depends on the second information signal.

The first information signal received by the power control unit is indicative of a transmit power of the radar transmit signal. The power control unit is configured to obtain the transmit power from the first information signal. The supply voltage control signal generated by the power control unit is suitable for the supply voltage to be set to a level for the radar power amplifier to amplify the input signal to the radar transmit signal with the transmit power as indicated in the first information signal. This allows for a setting of the supply voltage of the power amplifier in relation to the transmit power and thereby may lead to an improved noise performance of the power amplifier and a reduced noise level of the transmit signal at the required transmit power. The power amplifier may be operated in or close to the optimal saturation point, even during reduced power operation. Both, phase noise and amplitude noise may be improved. The supply voltage may be chosen in order to generate the radar transmit signal with a phase noise less than ~-148 dBc/Hz and/or an amplitude noise less than ~-150 dBc/Hz. The efficiency of the power amplifier may also be improved, so that e.g., thermal shutdown of the chip may be avoided.

The second information signal received by the power control unit is indicative of timing information of the input signal. The power control unit is configured to obtain the timing information from the second information signal. The timing information depends on characteristics of the input signal, e.g., the periodicity of characteristics of the input signal. The timing information influences the first duration of time for which the first supply voltage is applied to the radar power amplifier. The power control unit obtains the first duration of time from the second information signal. This allows for the setting of the supply voltage for the first duration of time, wherein the first duration of time can be obtained using the second information signal which is received by the power control unit before the supply voltage control signal is generated and before the supply voltage is actually set. The advantage is that the setting of the supply voltage can be done without the need of a feedback signal from the transmit signal.

According to an implementation the power control unit is further configured to generate a bias control signal for setting the bias of the radar power amplifier. The bias control signal depends on the first information signal. The bias control signal generated by the power control unit is suitable for the bias of the radar power amplifier to be set to a level suitable for the radar power amplifier to amplify the input signal to the radar transmit signal with the transmit power as indicated in the first information signal. The level of the bias may be set in such a way that the power amplifier operates efficiently and/or with low noise. The setting of the bias in addition to the supply voltage may further improve the noise performance and/or the efficiency of the power amplifier.

According to an implementation, the timing information of the input signal relates to the modulation of the input signal. The characteristics of the input signal, to which the timing information relates is the modulation scheme, for example the periodicity of the modulation. The input signal might for example be frequency chirp modulated (Frequency Modulated Continuous Wave FMCW). A chirp is a signal in which the frequency increases (up-chirp) or decreases (down-chirp) with time. For an input signal with periodically transmitted chirps, like e.g., an FMCW modulated signal, the timing information may relate to a period of the transmitted chirps. The timing information may relate to one or multiple chirps of the input signal. This means that the first during of time may relate to one or multiple chirps and that the first supply voltage is to be applied for a duration of one or multiple chirps.

Other modulation schemes like e.g., OFDM (Orthogonal Frequency-Division Multiplexing) or PMCW (Phase Modulated Continuous Wave) are also possible.

In an implementation, the input signal may be a radar signal with a frame structure. The frame is a periodically repeated structure of the radar signal. The timing information may relate to a frame of the input signal. This means that the first duration of time may relate to a frame or a fraction thereof and that the first supply voltage is to be applied for a duration of a frame or a fraction thereof.

According to an implementation of the power control unit the first duration of time corresponds to the time of transmitting one or multiple chirps and/or the first duration of time corresponds to the time of transmitting a frame or a fraction thereof.

In an implementation of the power control unit the first information signal includes information about a first transmit power for the radar transmit signal during the first duration of time. The information about a first transmit power, which is to be applied for the first duration of time, can thus be obtained from the first information signal. The length of the first duration of time may then be obtained from the second information signal.

In an implementation, the power control unit is further configured to generate the supply voltage control signal such that the supply voltage of the radar power amplifier is set to a second supply voltage value for a second duration of time wherein the second supply voltage value depends on the first information signal, and the second duration of time depends on the second information signal. Both, phase noise and amplitude noise may be improved by setting the first and second supply voltage to a suitable level. The first and second supply voltage may be chosen in order to generate the radar transmit signal for both power settings with a phase noise less than ~−148 dBc/Hz and/or an amplitude noise less than ~−150 dBc/Hz;

In an implementation of the power control unit the first information signal includes information about a second transmit power for the radar transmit signal during the second duration of time. The information about the second transmit power, which is to be applied for the second duration of time, can thus be obtained from the first information signal. The length of the second duration of time may then be obtained from the second information signal.

In an implementation of the power control unit the second duration of time relates to one or multiple chirps and/or the second duration of time relates to a frame or a fraction thereof. The second duration of time may relate to the same characteristics of the input signal as the first duration of time. In some implementations, the second duration of time relates to one or multiple chirps and the first duration of time also relates to one or multiple chirps. In some implementations the second duration of time relates to a frame or a fraction thereof and the first duration of time also relates to a frame or a fraction thereof.

According to an implementation the second duration of time corresponds to the time of transmitting one or multiple chirps and/or the second duration of time corresponds to the time of transmitting a frame or a fraction thereof. In some implementations, the second duration of time corresponds to the time of transmitting one or multiple chirps and the first duration of time also corresponds to the time of transmitting one or multiple chirps. In some implementations the second duration of time corresponds to the time of transmitting a frame or a fraction thereof and the first duration of time also corresponds to the time of transmitting a frame or a fraction thereof. The first and the second duration of time may be the same or different from each other.

In an implementation the power control unit is configured to read an information characterizing a relation between the supply voltage of the power amplifier and the transmit power of the radar transmit signal from a storage. The power control unit is configured to use the relation to obtain the supply voltage which is to be set at the power amplifier depending on the transmit power of the radar transmit signal. The relation between the supply voltage and the transmit power may depend on the temperature, in particular the temperature on the chip. In some implementations, the power control unit is configured to receive a third information signal indicative of the temperature to be used when reading the relation between the supply voltage and the transmit power from the storage. The power control unit is configured to obtain the temperature from the third information signal.

A radar system may include the power control unit and the radar power amplifier. The radar system may include one or more transmitters. Each transmitter may include a power amplifier to generate the radar transmit signal. In the radar system, one power control unit may be foreseen to generate the supply voltage control signal to sequentially set the supply voltage of each of the transmitters. The supply voltage may be the same for all the transmitters. The supply voltage may be set by the same supply voltage control signal or by individual supply voltage control signals which are generated sequentially by the power control unit.

According to an implementation, the radar system further includes a supply voltage setting device configured to receive the supply voltage control signal and to set the supply voltage of the radar power amplifier. The supply voltage setting device may receive the supply voltage control signal from the power control unit and may include a low dropout device and/or a DC/DC converter to set the supply voltage of the power amplifier.

In implementations of the radar system the radar power amplifier is configured to output the radar transmit signal with the first transmit power during a first transmission time with the length of the first duration of time and/or to output the radar transmit signal with the second transmit power during a second transmission time with the length of the second duration of time. The supply power of the power amplifier outputting the transmit signal is set depending on the supply power control signal generated by the power control unit. The power control unit receives the first information signal indicative of the first and/or second transmit power, obtains the first and/or second transmit power from the first information signal, and reads the corresponding supply voltage from the storage. It also receives the second information signal indicative of the first and second duration of time, obtains the first and/or second duration of time from the second information signal, and generates the supply voltage control signal accordingly.

A microcontroller may be foreseen to control the radar system. The signal processing for the radar system may be done on the microcontroller. The power control unit may receive the first, the second and/or the third information signal from the microcontroller. The microcontroller may be part of the radar system or be external to the radar system.

The power control unit may be part of the microcontroller. Alternatively or additionally, the power control unit may be part of the firmware of the radar system, it may in particular part of the firmware of the chip where the RF frontend is implemented. The power control unit may be another processing unit or part of another processing unit of the radar system.

A method for controlling the supply voltage Vcc of the radar power amplifier PA, which is configured to receive an input signal and to output a radar transmit signal. including:

S1: Receiving a first information signal indicative of a transmit power P_out of the radar transmit signal RF_out and a second information signal indicative of timing information of the input signal RF_in.

S2: Setting the supply voltage Vcc of the radar power amplifier PA to a first supply voltage value for a first duration of time, wherein the first supply voltage value depends on the first information signal, and the first duration of time depends on the second information signal.

The transmit power P_out may be obtained from the first information signal and the timing information may be obtained from the second information signal. The first duration of time may be obtained from the timing information.

The method may further include the step:

S3: outputting the radar transmit signal RF_out with a first transmit power P_out during a first transmission time with the length of the first duration of time.

The method may further include the step:

S5: setting the supply voltage Vcc of the radar power amplifier PA to a second supply voltage value for a second duration of time, wherein the second supply voltage value depends on the first information signal, and the second duration of time depends on the second information signal.

Optionally, before step S5 there may be a step S4, during which the first information signal and/or the second information signal may be received again. It is also possible that the first information signal received in step S1 contains information indicative of the second supply voltage and/or the second information signal received in step S1 contains information indicative of the second duration of time. It this case, step S4 may be omitted.

The method may further include the step:

S6: outputting the radar transmit signal RF_out with a second transmit power P_out during a second transmission time with the length of the second duration of time.

Optionally, no radar transmit signal may be output during a transition time in between the first and the second transmission time in between step S5 and step S6. The transition time may be used to set the supply voltage to another value and the ripple of the supply voltage Vcc can be allowed to settle during the transition time.

BRIEF DESCRIPTION OF THE DRAWINGS

Implementations will now be described with reference to the attached drawing figures by way of example only. Like reference numerals are used to refer to like elements throughout. The illustrated structures and devices are not necessarily drawn to scale.

DETAILED DESCRIPTION

Figure 1:
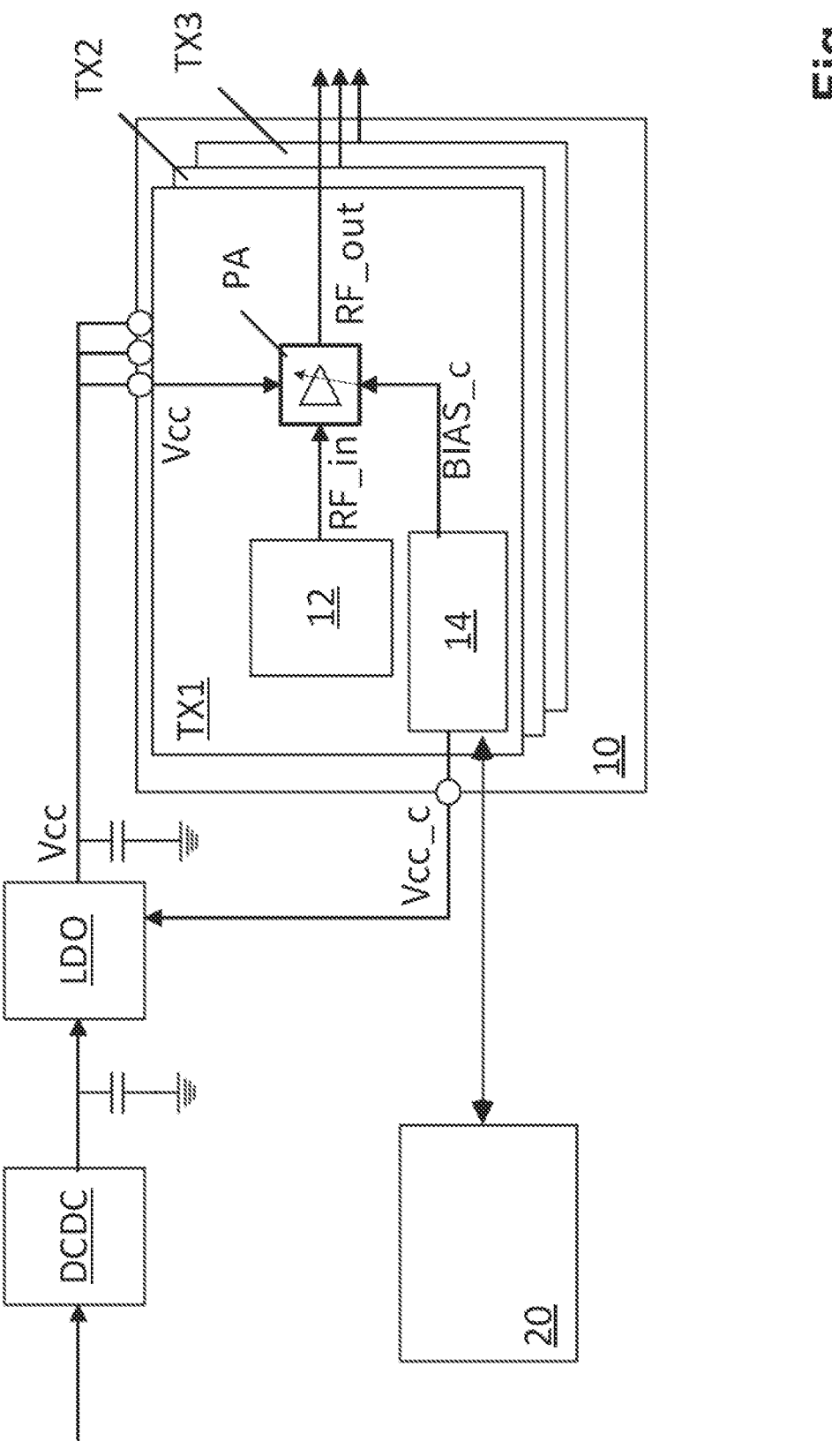
FIG. 1 illustrates a schematic block diagram of an example of a radar system.

FIG. 1 illustrates a radar system 10 with three transmit channels in the following referred to as transmitters TX1, TX2, TX3. The transmitters TX1, TX2, TX3 each may be part of a transceiver. The receivers of the transceivers of the radar system 10 are not shown in the figure. Each transmitter TX1, TX2, TX3 comprises a power amplifier PA and an RF generator 12, which generates the input signal RF_in for the power amplifier PA. The RF generator 12 may include circuit components such as a mixer, a frequency ramp generating circuit, a PLL etc. The radar power amplifier PA is configured to receive the input signal RF_in and to output a radar transmit signal RF_out. The radar system 10 may for example be realized on a semiconductor chip, e.g., in an integrated manner. An example for such a realization is a monolithic microwave integrated circuit (MMIC), which is a type of integrated circuit device that operates at microwave frequencies, in particular 300 MHz to 300 GHz.

A power control unit 14 is configured to receive a first information signal indicative of an intended transmit power P_out of the radar transmit signal RF_out and a second information signal indicative of timing information of the input signal RF_in. The first and second information signal may for example be received from a microcontroller 20, which may additionally control the radar system 10, by e.g., controlling the RF generator 12 and other elements of the radar system 10, which are not shown in the figure. The microcontroller 20 may also perform additional radar signal processing operations, like for example FFT's. Microcontroller 20 may be implemented on the same MMIC or external to the MMIC.

A power control unit 14 generates a bias control signal BIAS_c which is used to set the bias of the power amplifier PA. The bias is set to a level suitable for a transmit power P_out of the radar transmit signal RF_out. Setting the bias of the power amplifier PA involves setting the initial operation conditions including e.g., current and/or voltage supplied to the power amplifier PA. The transmit power P_out can be obtained by the power control unit 14 from the first information signal.

The power control unit 14 further generates a supply voltage control signal Vcc_c for controlling the supply voltage Vcc of the radar power amplifier PA. The power control unit generates the supply voltage control signal Vcc_c such that the supply voltage Vcc of the radar power amplifier PA is set to a first supply voltage value for a first duration of time. The first supply voltage value depends on the transmit power P_out which can be obtained by the power control unit 14 from the first information signal. The first duration of time depends on the length of the transmission with the transmit power. It may be obtained by the power control unit 14 from the timing information of the second information signal.

The supply voltage control signal Vcc_c is transmitted to a low dropout device LDO to set the supply voltage Vcc of the power amplifier PA. In this implementation the low dropout device LDO acts as the supply voltage setting device for the radar system 10. A low dropout device is a linear DC voltage regulator that can regulate its output voltage even when its input voltage is close to its output voltage. The low dropout device LDO provides the supply voltage Vcc to the power amplifier PA. The value of the supply voltage depends on the supply voltage control signal Vcc_c. The input voltage to the low dropout device LDO is provided by a DC/DC-converter DCDC. The DC/DC-converter DCDC regulates electric power by turning on and off switching elements, e.g., FETs. Using a DC/DC-converter followed by a low dropout device LDO allows for a low noise and high efficiency provision of the supply voltage Vcc to the power amplifier PA, which can be further improved by setting the supply voltage Vcc depending on the supply voltage control signal Vcc_c.

In an implementation, the same value of supply voltage Vcc may be set for each of the transmitters TX1, TX2, TX3. The timing of the applied supply voltage Vcc may be different for the transmitters TX1, TX2, TX3. In some implementations, the supply voltage of a circuit section of the chip or the supply voltage for the whole chip may be set by the control signal Vcc_c. In other words, the supply voltage for the circuit section or the supply voltage for the chip may in such implementations be determined by the supply voltage setting for the radar power amplifier PA.

The phase and amplitude noise of the power amplifier PA can be significantly improved when the supply voltage Vcc is suitably reduced based on the intended output power, e.g., for low output power P_out levels. If a low transmit power P_out is required and the supply voltage Vcc is kept at a high level, the current through the power amplifier PA stages may need to be significantly reduced, which may deteriorate the noise performance. This can be overcome by suitably setting the supply voltage Vcc based on the intended output power. Another additional benefit of suitably setting the supply voltage Vcc is that the efficiency may be improved. The efficiency of the power amplifier PA can be improved by suitably setting the supply voltage Vcc for example in the situation when the supply voltage Vcc is reduced in case the output power P_out is reduced. Increased efficiency also means that less heat is dissipated on chip, less heat needs to be absorbed on chip and results in less on-chip heating.

The power control unit 14 may for example be realized on the chip of the radar system 10, e.g., on the firmware of a MMIC. Each of the transmitters TX1, TX2, TX3 may comprise a power control unit 12, which generates the supply voltage control signal Vcc_c for the associated power amplifier PA. Alternatively or additionally, one power control unit 12 may be foreseen for several transmitters TX1, TX2, TX3, that generates the supply voltage control signal Vcc_c for the transmitters TX1, TX2, TX3, e.g., in a sequential manner. Similarly, there may be one low dropout device LDO and/or DC/DC-converter DCDC for the transmitters TX1, TX2, TX3 of the radar system 10 or there may be a separate low dropout device LDO and/or DC/DC-converter DCDC for each of the transmitters TX1, TX2, TX3. A combination of separate and common low dropout device LDO and/or DC/DC-converter DCDC is also possible. It is to be noted that in other implementations other concepts of DC/DC converting may be used to provide the supply voltage.

Figure 2:
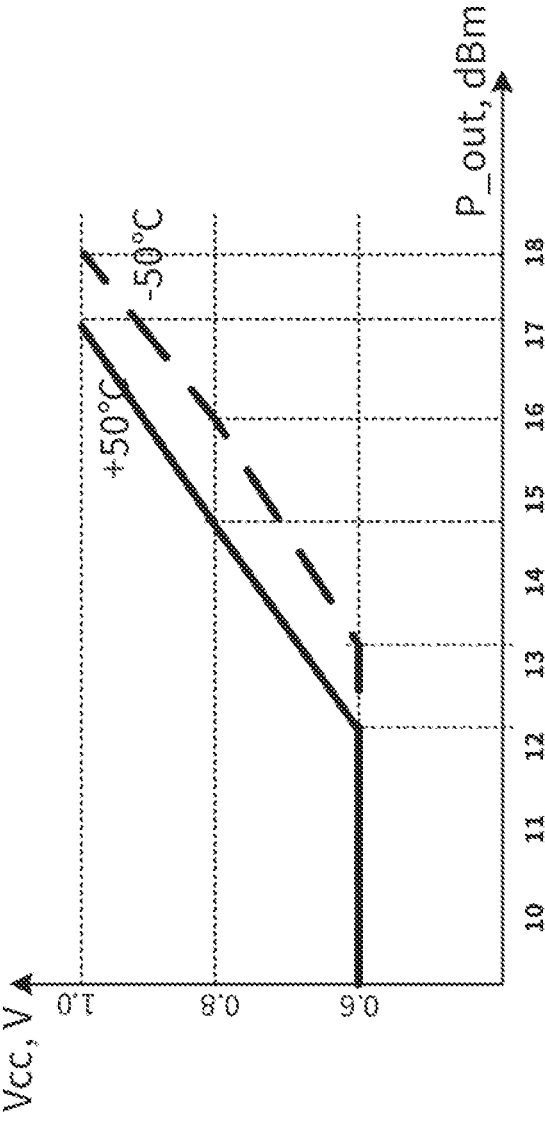
FIG. 2 illustrates an example of a relation between a supply voltage and transmit power.

FIG. 2 shows the relation between the supply voltage Vcc and the desired transmit power P_out. The supply voltage Vcc to be set is dependent on the transmit power P_out and the on-chip temperature. The curves in FIG. 2 show two sample relations at +50° C. and at −50° C. on-chip temperature. Other relations at other temperatures between +50° C. and −50° C. lie between the two curves shown. The relation can be stored in a storage of the radar system 10 or in a storage outside the radar system 10. The storage could for example be on the same chip as the radar system 10 or alternatively or additionally part of the microprocessor 20.

The power control unit 14 reads the relation from the storage and generates the supply voltage control signal Vcc_c depending on the transmit power P_out and the temperature on the chip. The temperature on the chip may be received by the power control unit 14, e.g., from the microcontroller 20 or from a temperature measuring device. In some implementations, the power control unit 14 generates the bias control signal BIAS_c which is used to set the bias of the power amplifier PA in addition to the supply voltage control signal Vcc_c. This allows for the power control loop to work based on a combination of the bias and the supply voltage Vcc. Bias and supply voltage Vcc may be set according to the temperature and the desired transmit power P_out.

Figure 3:
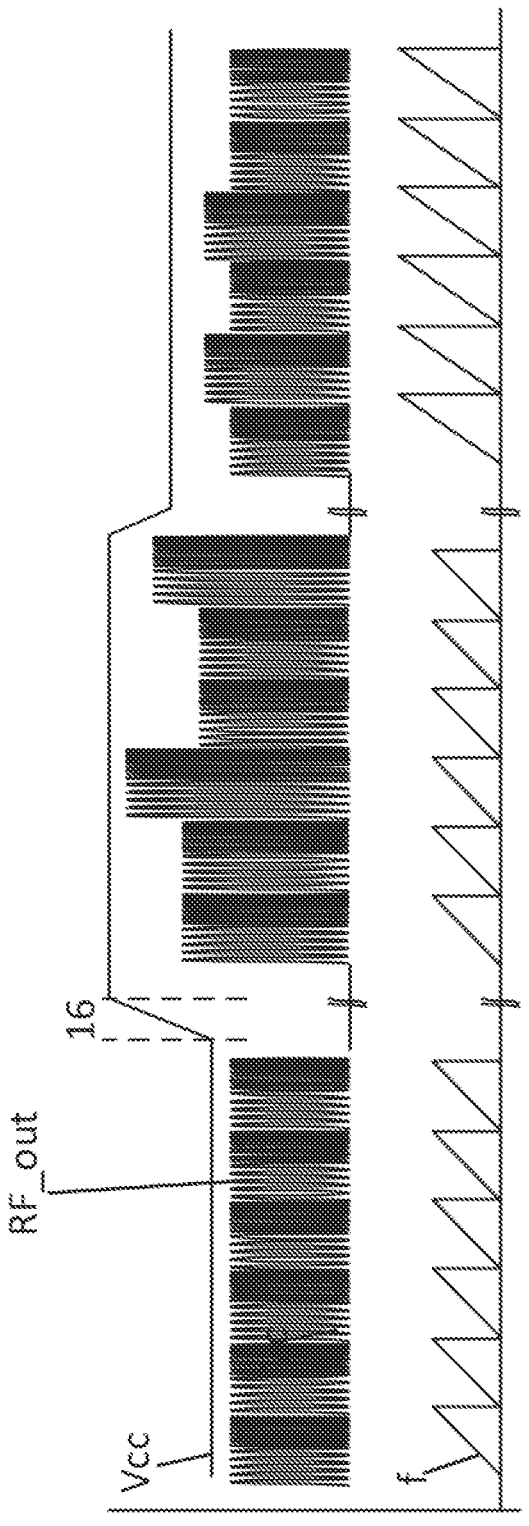
FIG. 3 illustrates an example of a transmit signal over time, the associated signal frequency over time and a supply voltage over time.
Figure 3:

FIG. 3 shows an example of a frequency modulated continuous wave (FMCW) transmit signal RF_out, its frequency f and its relationship with the supply voltage Vcc. The amplitude of the transmit signal RF_out gives an indication of the power of the signal and the transmit power P_out needed. As shown in FIG. 3, the frequency f of the transmit signal RF_out is increased during a chirp, followed by another chirp. A so-called frame of the signal comprises several chirps and is followed by a transition time 16, during which no transmit signal RF_out is generated. The length of a transition time may for example be around 20 to 200 µs. After the transition time, another frame starts.

In the example shown in FIG. 3, the first duration of time corresponds to the length of a frame. The power control unit 14 receives the required output power P_out with the first information signal and the length of the frame for which the output power P_out is required with the second information signal. The power control unit 14 receives the correspondence between the output power P_out and the supply voltage—as shown in FIG. 2—from the storage. The power control unit 14 is configured to then generate the supply voltage control signal Vcc_c to set the supply voltage Vcc to the level as obtained from the correspondence of FIG. 2. The actual setting of the supply voltage Vcc is done by a supply voltage setting device, which may comprise a low dropout device LDO and/or a DC/DC-converter DCDC. The generated supply voltage Vcc may for example have a ripple of around 10 to 100 µVrms. The ripple can be allowed to settle during the transition time 16 in between two different supply voltages Vcc. The duration of time for which the supply voltage Vcc is set to this level is corresponds to a frame for this example and is known before the actual transmission of the frame. During the transition time 16, the supply voltage Vcc may be changed—in the same manner as described before taking into account the intended transmission power for the next frame—and then applied for the next transmission after the transition time 16.

The transmit signal RF_out and the transmit power P_out associated with it is known to the microcontroller 20. The microcontroller 20 also controls the modulation of the transmit signal RF_out, which may relate to the timing information. The timing information in the example shown in FIG. 3 relates to a frame of the transmit signal RF_out. The microcontroller may communicate with the power control unit 14 to transmit this information via the first and the second information signal.

Figure 4:
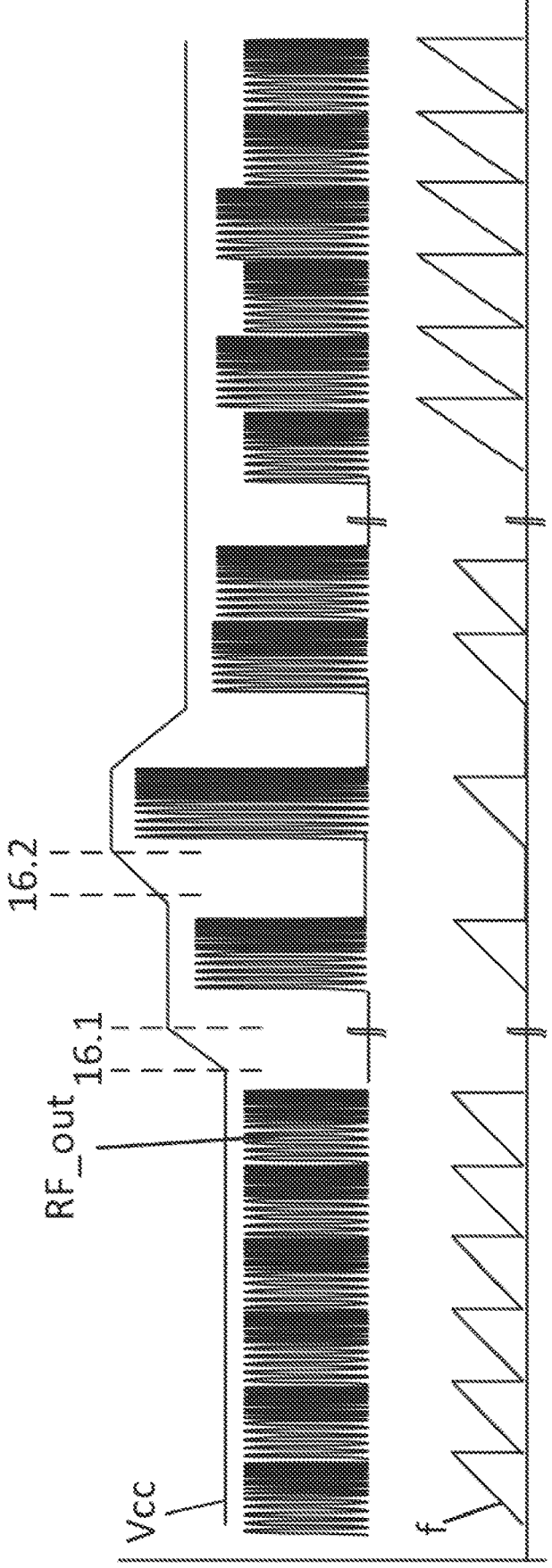
FIG. 4 illustrates another example of a transmit signal, the associated signal frequency, and a supply voltage over time.
Figure 4:
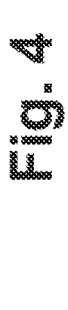

FIG. 4 shows another example of a transmit signal RF_out, its frequency f and its relationship with the supply voltage Vcc_c. The amplitude of the transmit signal RF_out gives an indication of the power of the signal and the transmit power P_out needed. As in FIG. 3, the frequency f of the transmit signal RF_out is increased during a chirp, followed by another chirp. The first frame of the signal comprises several chirps and is followed by a transition time 16.1, during which no transmit signal RF_out is generated and the supply voltage Vcc is set to another value. After the transition time 16.1, another frame starts. In FIG. 4 the frame after the transition time 16.1 comprises one chirp only. The one chirp is followed by another transition time 16.2, during which no transmit signal RF_out is generated and the supply voltage Vcc is set to another value. After the transition time 16.2, another frame starts. In FIG. 4 the frame after the transition time 16.2 also comprises one chirp only.

In the example shown in FIG. 4, the first duration of time corresponds to the length of a frame. During the transition time 16.1, the supply voltage Vcc is changed—in the same manner as described before—and then applied for the next transmission after the transition time 16.1. During the transition time 16.2, the supply voltage Vcc is changed again and then applied to the next transmission after the transition time 16.2—in this example, for one chirp only again.

The transmit signal RF_out and the transmit power P_out associated with it is known to the microcontroller 20. In some implementations, customers may program specific configurations of the transmit power values intended for the respective transmit time intervals and/or different TX transmitters. The microcontroller 20 also controls the modulation of the transmit signal RF_out, the transition times 16.1, 16.2 as well as the length of the time duration, for which a certain transmit power P_out is required for transmission. The microcontroller may communicate with the power control unit 14 to transmit this information via the first and the second information signal. In some implementations, the transmit power might be set to change within a frame. The setting of the supply voltage Vcc may for example then take into account the highest transmit power within the frame.

In some implementations, the value for setting the supply voltage may be determined or calculated based on the intended transmit power and the measured temperature from predetermined information like look-up tables, extrapolation or interpolation of modelled or measured structured information. Such information which may be stored or input to the MMIC or microcontroller may allow to determine the effect of different supply power settings for the phase noise and/or amplitude noise of the power amplifier PA at specific transmit powers and temperatures. In some implementations, the supply voltage setting may be calculated and set based on at least one of the above-described information to obtain a phase noise of less than around 148 dBc/Hz and/or an amplitude noise of less than around 150 dBc/Hz.

Figure 5:
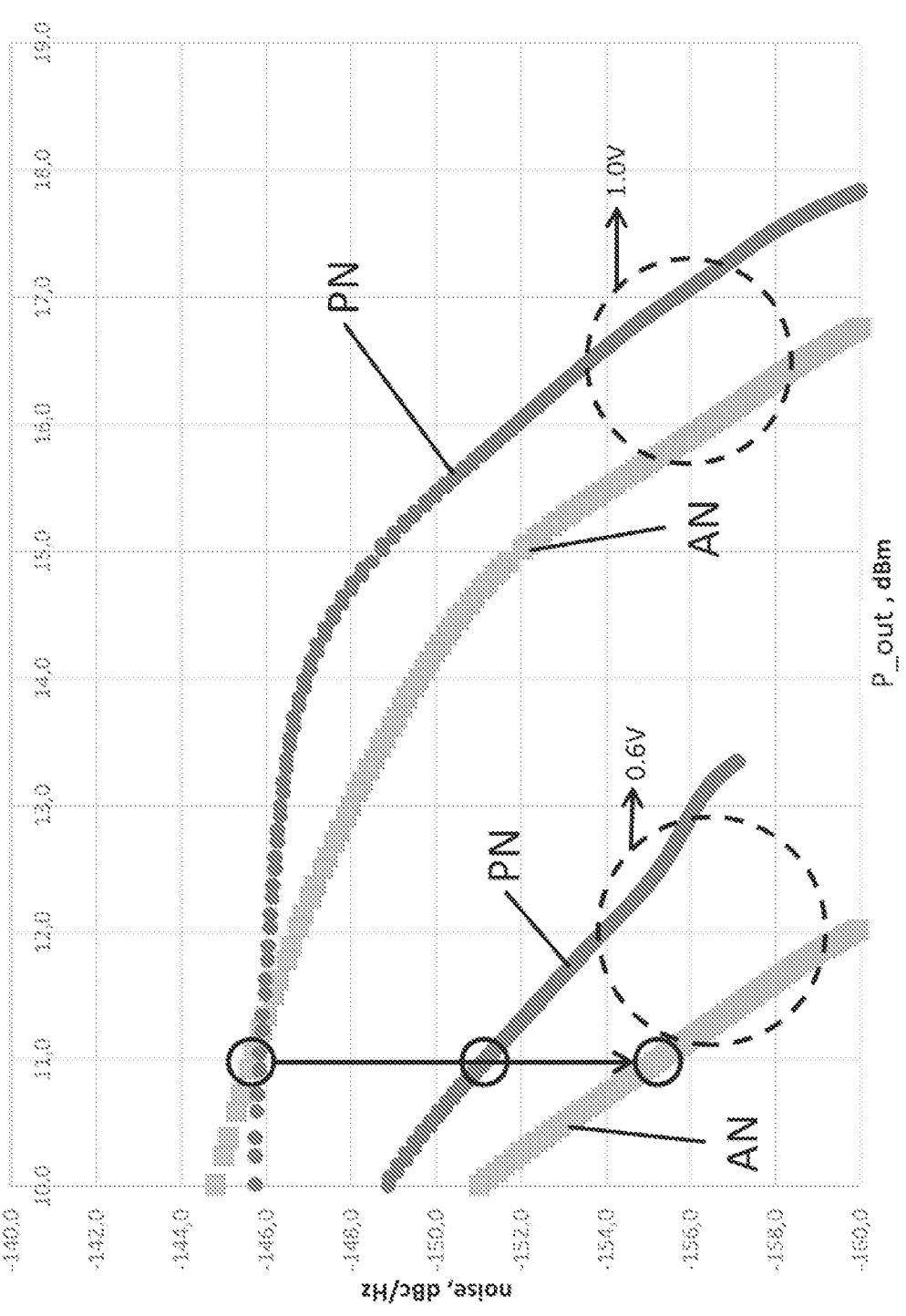
FIG. 5 illustrates an example of a relation between noise over transmit power for different supply voltage levels.

An example of the effect of a reduced supply voltage Vcc is illustrated in FIG. 5, where amplitude noise AN and phase noise PN are shown for two different supply voltage Vcc levels of 0.6 V in the left curves and 1.0 V in the right curves. If a low transmit power P_out is required for a high supply voltage Vcc, the current through PA stages needs to be significantly reduced which deteriorates the noise performance of the power amplifier PA. FIG. 5 illustrates that the phase noise PN and amplitude noise AN of the power amplifier PA may significantly improve, when the supply voltage Vcc is reduced for lower transmit power P_out levels. At 11 dBm transmit power P_out, the amplitude noise AN may improve by 10 dB and the phase noise PN by 6 dB, when the supply voltage Vcc of the power amplifier PA is reduced from 1.0V down to 0.6V.

Figure 6:
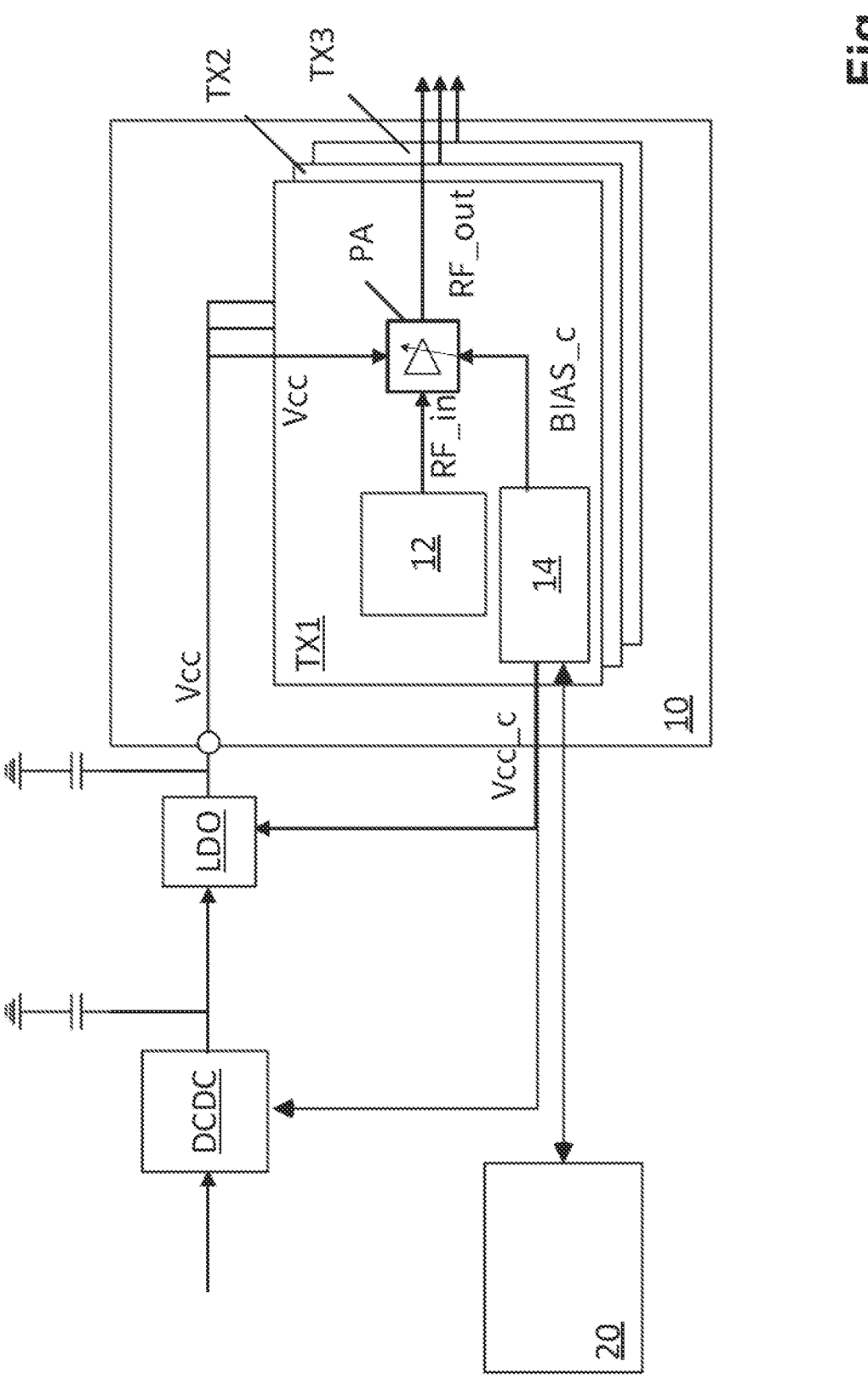
FIGS. 6-8 each illustrates a schematic block diagram of other examples of a radar system.
Figure 7:
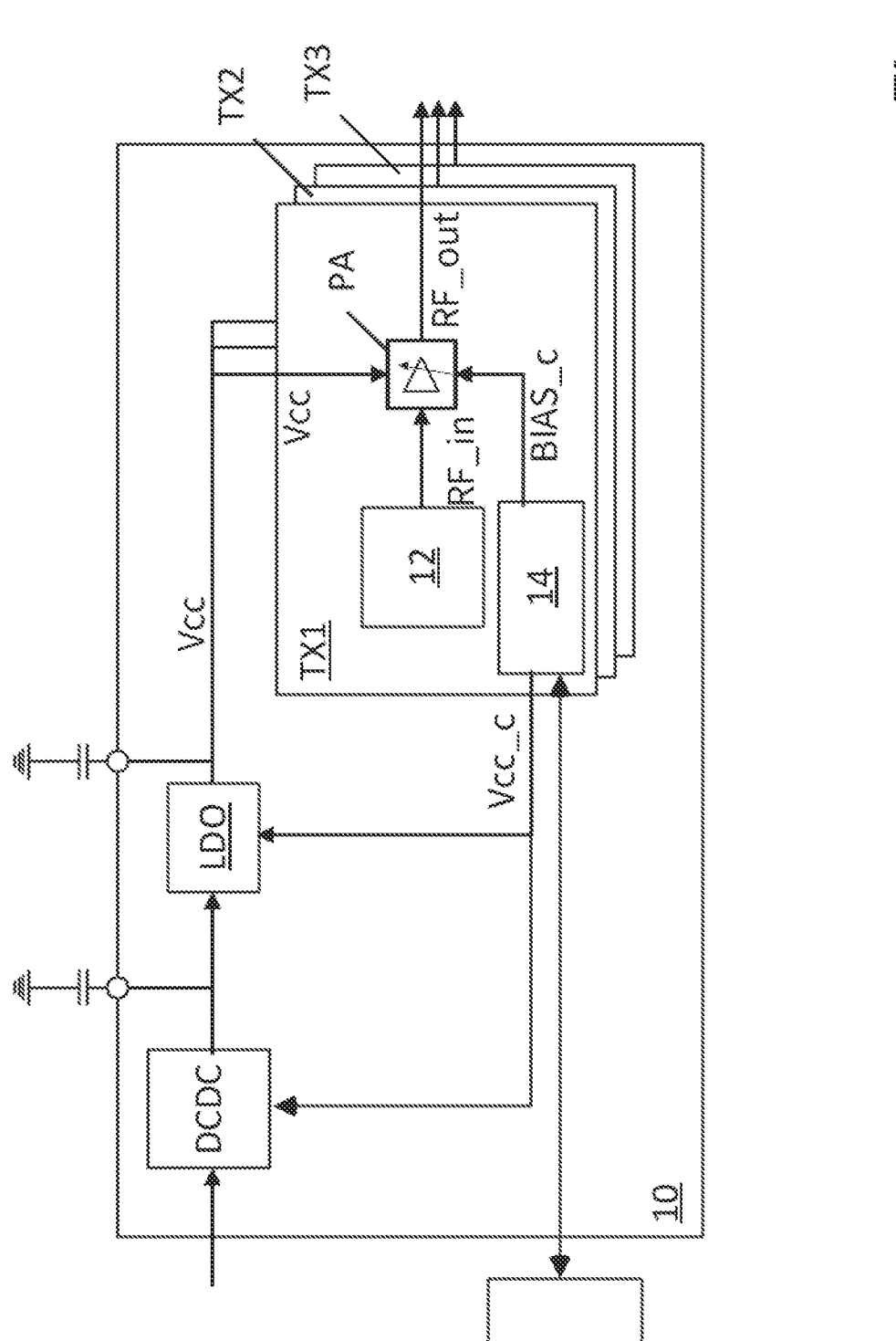
Figure 8:

FIGS. 6-8 each show a schematic block diagram of other examples of a radar system 10.

In the radar system 10 of FIG. 6 the supply voltage control signal Vcc_c is applied to the DC/DC-converter DCDC in addition to the low dropout device LDO. The DC/DC-converter DCDC and the low dropout device LDO are controlled together by the supply voltage control signal Vcc_c. In this implementation the low dropout device LDO and the DC/DC-converter DCDC are both comprised in the supply voltage setting device. The DC/DC-converter DCDC can reduce its output voltage and thus the input voltage to the low dropout device LDO without significant loss of efficiency, so that the voltage drop at the low dropout device LDO can be kept almost constant and keep its efficiency at a higher level, i. e. keep the heat dissipation across the low dropout device LDO at a reduced level.

In the radar system 10 of FIG. 7 the DC/DC-converter DCDC and the low dropout device LDO are both part of the radar system 10 and may be integrated on-chip with the radar system 10. In this implementation the low dropout device LDO and the DC/DC-converter DCDC are both comprised in the supply voltage setting device. The DC/DC-converter DCDC and the low dropout device LDO are controlled together by the supply voltage control signal Vcc_c. In addition to the advantages of the implementation shown in FIG. 6, this allows for further improving the noise efficiency performance of the radar system 10 and for further integration of the radar system 10.

In the radar system 10 of FIG. 8 the power control unit 14 is implemented on the microcontroller 20. The microcontroller 20 is part of the radar-system and may be integrated on-chip together with the other elements of the radar system 10. The DC/DC-converter DCDC and the low dropout device LDO are controlled together by the supply voltage control signal Vcc_c, which is generated by the power control unit 14. In this implementation the low dropout device LDO and the DC/DC-converter DCDC are both comprised in the supply voltage setting device. The power control unit 14 may generate the supply voltage control signal Vcc_c sequentially for each of the transmitters TX1, TX2, TX3 so that the supply voltage control signal is set sequentially for each of the transmitters TX1, TX2, TX3 by the supply voltage setting device.

Figure 9:
FIG. 9 illustrates a method for controlling the supply voltage of a radar power amplifier.

FIG. 9 illustrates a method for controlling the supply voltage Vcc of the radar power amplifier PA. In implementations, the power control unit 14 is configured to perform the method. The method comprises:

S1: Receiving a first information signal indicative of a transmit power P_out of the radar transmit signal RF_out and a second information signal indicative of timing information of the input signal RF_in.

The transmit power P_out as indicated by the first information signal is for example the highest power of the transmit signal RF_out during the first duration of time. This determination may for example be done by the microcontroller 20 and then be received by the power control unit 14. Also, the highest transmit power P_out during the first duration of time may be determined by the power control unit 14 itself, based on the information contained within the first information signal and/or the second information signal.

The method further comprises:

S2: Setting the supply voltage Vcc of the radar power amplifier PA to a first supply voltage value for a first duration of time, wherein the first supply voltage value depends on the first information signal, and the first duration of time depends on the second information signal.

Before setting the supply voltage Vcc the relation between the supply voltage Vcc and the transmit power P_out, as illustrated in FIG. 2, is looked up in the storage.

The method may further comprise the step:

S3: outputting the radar transmit signal RF_out with a first transmit power P_out during a first transmission time with the length of the first duration of time.

The method may further comprise the step:

S5: setting the supply voltage Vcc of the radar power amplifier PA to a second supply voltage value for a second duration of time, wherein the second supply voltage value depends on the first information signal, and the second duration of time depends on the second information signal.

Optionally, before step S5 there may be a step S4, during which the first information signal and/or the second information signal may be received again. It is also possible that the first information signal received in step S1 contains information indicative of the second supply voltage and/or the second information signal received in step S1 contains information indicative of the second duration of time. It this case, step S4 may be omitted.

The method may further comprise the step:

S6: outputting the radar transmit signal RF_out with a second transmit power P_out during a second transmission time with the length of the second duration of time.

Optionally, no radar transmit signal may be output during a transition time 16, 16.1, 16.2 in between the first and the second transmission time in between step S5 and step S6. The transition time 16, 16.1, 16.2 may be used to set the supply voltage to another value and the ripple of the supply voltage Vcc can be allowed to settle during the transition time 16, 16.1, 16.2.

It may also be foreseen to measure the supply voltage Vcc at the power amplifier PA and to report it back to the power control unit 14 and/or the microcontroller 20.

REFERENCE SIGNS 10 radar system
12 RF generator
14 power control unit
16, 16.1, 16.2 transition time
20 microcontroller
TX1, TX2, TX3 transmitter circuit
PA RF power amplifier
DCDC DC/DC converter
LDO low dropout device
RF_in input signal
RF_out transmit signal
Vcc supply power
Vcc_c power control signal
BIAS_c bias control signal
P_out transmit power
f frequency
PN phase noise
AN amplitude noise
S1, S2, S3, S4, S5, S6 steps of method

The invention claimed is:

1. A power control unit configured to generate a supply voltage control signal for controlling a supply voltage of a radar power amplifier, which is configured to receive an input signal and output a radar transmit signal with a desired transmit power, wherein the power control unit is configured to:

receive a first information signal indicative of the desired transmit power of the radar transmit signal and a second information signal indicative of timing information of the input signal, and generate the supply voltage control signal and provide the supply voltage control signal to a DC/DC converter and to a low dropout device such that the DC/DC converter and the low dropout device are controlled together in order to set the supply voltage of the radar power amplifier to a first supply voltage value for a first duration of time, wherein the first supply voltage value depends on the first information signal and the first duration of time depends on the second information signal, wherein the power control unit is configured to read information characterizing a relation between the supply voltage of the radar power amplifier and the desired transmit power from a storage device, wherein the power control unit is configured to receive a third information signal indicative of a temperature of a radar chip comprising the radar power amplifier, wherein the relation between the supply voltage of the radar power amplifier and the desired transmit power depends on the temperature indicated by the third information signal, and wherein the power control unit is configured to generate the supply voltage control signal based on the desired transmit power, the temperature of the radar chip, and the relation between the supply voltage of the radar power amplifier and the desired transmit power, which depends on the temperature of the radar chip indicated by the third information signal, such that the desired transmit power is provided by the radar power amplifier.

2. The power control unit according to claim 1, wherein the power control unit is further configured to generate a bias control signal for setting a bias of the radar power amplifier, wherein the bias control signal depends on the first information signal.

3. The power control unit according to claim 1, wherein the timing information relates to a modulation of the input signal.

4. The power control unit according to claim 3, wherein the input signal is a signal with periodically transmitted chirps, and wherein the timing information relates to a period of the periodically transmitted chirps.

5. The power control unit according to claim 1, wherein the input signal is a radar signal with a frame structure, and wherein the timing information relates to a frame of the input signal.

6. The power control unit according to claim 1, wherein the first duration of time relates to one or multiple chirps of the input signal or the first duration of time relates to a frame or a fraction thereof of the input signal.

7. The power control unit according to claim 1, wherein the first duration of time corresponds to a time of transmitting one or multiple chirps of the radar transmit signal or the first duration of time corresponds to a time of transmitting a frame or a fraction thereof of the radar transmit signal.

8. The power control unit according to claim 1, wherein the first information signal comprises information about a first desired transmit power for the radar transmit signal during the first duration of time.

9. The power control unit according to claim 1, wherein the power control unit is configured to generate the supply voltage control signal such that the supply voltage of the radar power amplifier is set to a second supply voltage value for a second duration of time, and wherein the second supply voltage value depends on the first information signal, and the second duration of time depends on the second information signal.

10. The power control unit according to claim 9, wherein the second duration of time relates to one or multiple chirps of the input signal or the second duration of time relates to a frame or a fraction thereof of the input signal.

11. The power control unit according to claim 9, wherein the second duration of time corresponds to a time of transmitting one or multiple chirps of the radar transmit signal or the second duration of time corresponds to a time of transmitting a frame or a fraction thereof of the radar transmit signal.

12. The power control unit according to claim 1, wherein the power control unit is configured to adjust the supply voltage control signal to adjust the first supply voltage value based on a change in the temperature of the radar chip.

13. The power control unit according to claim 12, wherein the desired transmit power of the radar transmit signal changes over time.

14. The power control unit according to claim 1, wherein the supply voltage control signal is configured to set the first supply voltage value to be proportional to the desired transmit power.

15. A radar system, comprising:
a radar power amplifier configured to receive an input signal and to output a radar transmit signal with a desired transmit power;
a power control unit configured to generate a supply voltage control signal for controlling a supply voltage of the radar power amplifier, wherein the power control unit is configured to:
receive a first information signal indicative of a desired transmit power of the radar transmit signal, a second information signal indicative of timing information of the input signal, and a third information signal indicative of a temperature of a radar chip comprising the radar power amplifier,
read information characterizing a relation between the supply voltage of the radar power amplifier and the desired transmit power from a storage device, wherein the relation between the supply voltage of the radar power amplifier and the desired transmit power depends on the temperature indicated by the third information signal, and
generate the supply voltage control signal such that the supply voltage of the radar power amplifier is set to a first supply voltage value for a first duration of time, wherein the first supply voltage value depends on the first information signal and the first duration of time depends on the second information signal,
wherein the power control unit is configured to generate the supply voltage control signal based on the desired transmit power, the temperature of the radar chip, and the relation between the supply voltage of the radar power amplifier and the desired transmit power, which depends on the temperature of the radar chip indicated by the third information signal, such that the desired transmit power is provided by the radar power amplifier; and
a supply voltage setting device comprising a DC/DC converter and a low dropout device that are both configured to receive the supply voltage control signal, wherein the DC/DC converter and a low dropout device are configured, in combination, to set the supply voltage of the radar power amplifier based on the supply voltage control signal.

16. The radar system according to claim 15, wherein the power control unit is configured to generate the supply voltage control signal such that the supply voltage of the radar power amplifier is set to a second supply voltage value for a second duration of time, and wherein the second supply voltage value depends on the first information signal, and the second duration of time depends on the second information signal,
wherein the radar power amplifier is configured to output the radar transmit signal with a first desired transmit power during a first transmission time with a length of the first duration of time or output the radar transmit signal with a second desired transmit power during a second transmission time with a length of the second duration of time.

17. The radar system according to claim 15, wherein the DC/DC converter is configured, based on the supply voltage control signal, to generate an output voltage and provide the output voltage to an input of the low dropout device, and
wherein the low dropout device is configured, based on the supply voltage control signal and the output voltage, provide the supply voltage of the radar power amplifier.

18. The radar system according to claim 17, wherein the DC/DC converter is configured, based on the supply voltage control signal, to adjust the output voltage in order to maintain a voltage drop at the low dropout device substantially constant.

19. A method for controlling a supply voltage of a radar power amplifier, which is configured to receive an input signal and output a radar transmit signal with a desired transmit power, the method comprising:
receiving a first information signal indicative of a desired transmit power of the radar transmit signal;
receiving a second information signal indicative of timing information of the input signal;
receiving a third information signal indicative of a temperature of a radar chip comprising the radar power amplifier;
reading information characterizing a relation between the supply voltage of the radar power amplifier and the desired transmit power from a storage device, wherein the relation between the supply voltage of the radar power amplifier and the desired transmit power depends on the temperature indicated by the third information signal; and
generating a supply voltage control signal for controlling the supply voltage of the radar power amplifier;
providing the supply voltage control signal to both a DC/DC converter and a low dropout device; and
setting, based on the supply voltage control signal by a combination of the DC/DC converter and the low dropout device, the supply voltage of the radar power amplifier to a first supply voltage value for a first duration of time, wherein the first supply voltage value depends on the first information signal, and wherein the first duration of time depends on the second information signal,
wherein setting the supply voltage of the radar power amplifier includes generating the supply voltage control signal based on the desired transmit power, the temperature of the radar chip, and the relation between the supply voltage of the radar power amplifier and the desired transmit power, which depends on the temperature of the radar chip indicated by the third information signal, such that the desired transmit power is provided by the radar power amplifier.

20. The method according to claim 19, further comprising:

outputting the radar transmit signal with a first transmit power during a first transmission time with a length of the first duration of time.

21. The method according to claim 20, further comprising:

setting the supply voltage of the radar power amplifier to a second supply voltage value for a second duration of time, wherein the second supply voltage value depends on the first information signal, and wherein the second duration of time depends on the second information signal.

22. The method according to claim 21, further comprising:

outputting the radar transmit signal with a second transmit power during a second transmission time with a length of the second duration of time.

23. The method according to claim 22, wherein no radar transmit signal is output during a transition time in between the first transmission time and the second transmission time.

24. A radar system, comprising:

a radar power amplifier configured to receive an input signal and to output a radar transmit signal with a desired transmit power; and a power control unit configured to generate a supply voltage control signal for controlling a supply voltage of the radar power amplifier, wherein the power control unit is configured to:

receive a first information signal indicative of a desired transmit power of the radar transmit signal and a second information signal indicative of timing information of the input signal, read information characterizing a relation between the supply voltage of the radar power amplifier and the desired transmit power from a storage device, and generate the supply voltage control signal such that the supply voltage of the radar power amplifier is set to a first supply voltage value for a first duration of time, wherein the first supply voltage value depends on the first information signal and the first duration of time depends on the second information signal, wherein the power control unit is configured to generate the supply voltage control signal based on the information such that the desired transmit power is provided by the radar power amplifier; and a supply voltage setting device comprising a DC/DC converter and a low dropout device that are both configured to receive the supply voltage control signal, wherein the DC/DC converter and a low dropout device are configured, in combination, to set the supply voltage of the radar power amplifier based on the supply voltage control signal.

* * * * *